US008283742B2

(12) United States Patent
Motz et al.

(10) Patent No.: US 8,283,742 B2
(45) Date of Patent: Oct. 9, 2012

(54) THIN-WAFER CURRENT SENSORS

(75) Inventors: Mario Motz, Wernberg (AT); Udo Ausserlechner, Villach (AT)

(73) Assignee: Infineon Technologies, A.G., Neubiberg (DE)

( * ) Notice: Subject to any disclaimer, the term of this patent is extended or adjusted under 35 U.S.C. 154(b) by 137 days.

(21) Appl. No.: 12/872,665

(22) Filed: Aug. 31, 2010

(65) Prior Publication Data

US 2012/0049304 A1 Mar. 1, 2012

(51) Int. Cl.
*H01L 27/22* (2006.01)
(52) U.S. Cl. ............................ 257/427; 257/E29.323
(58) Field of Classification Search .................. 257/427, 257/E29.323
See application file for complete search history.

(56) References Cited

U.S. PATENT DOCUMENTS

| 4,894,610 | A | 1/1990 | Friedl |
| 5,017,804 | A | 5/1991 | Harnden |
| 5,041,780 | A | 8/1991 | Rippel |
| 5,786,976 | A * | 7/1998 | Field ............................ 361/215 |
| 6,341,416 | B1 * | 1/2002 | Biskeborn et al. ......... 29/603.12 |
| 6,356,068 | B1 | 3/2002 | Steiner |
| 6,424,018 | B1 | 7/2002 | Ohtsuka |
| 6,462,531 | B1 | 10/2002 | Ohtsuka |
| 6,683,448 | B1 | 1/2004 | Ohtsuka |
| 6,727,683 | B2 | 4/2004 | Goto |
| 6,940,265 | B2 | 9/2005 | Hauenstein |
| 6,949,927 | B2 | 9/2005 | Goetz |
| 6,995,315 | B2 | 2/2006 | Sharma |
| 7,075,287 | B1 | 7/2006 | Mangtani |
| 7,129,691 | B2 | 10/2006 | Shibahara |
| 7,166,807 | B2 | 1/2007 | Gagnon |
| 7,259,545 | B2 | 8/2007 | Stauth |
| 7,375,507 | B2 | 5/2008 | Racz |
| 7,474,093 | B2 | 1/2009 | Ausserlechner |
| 7,476,816 | B2 | 1/2009 | Doogue |
| 7,476,953 | B2 | 1/2009 | Taylor |
| 8,159,254 | B2 * | 4/2012 | Kaltalioglu .............. 324/762.01 |
| 2001/0052780 | A1 | 12/2001 | Hayat-Dawoodi |
| 2008/0035923 | A1 * | 2/2008 | Tschmelitsch et al. ......... 257/48 |
| 2008/0297138 | A1 | 12/2008 | Taylor |
| 2009/0050990 | A1 * | 2/2009 | Aono et al. .................... 257/415 |
| 2009/0058412 | A1 | 3/2009 | Taylor |
| 2010/0156394 | A1 | 6/2010 | Ausserlechner |
| 2011/0234215 | A1 * | 9/2011 | Ausserlechner .............. 324/244 |

(Continued)

FOREIGN PATENT DOCUMENTS

DE 19821492 11/1999

(Continued)

OTHER PUBLICATIONS

Steiner et al., "Fully Packaged CMOS Current Monitor Using Lead-On-Chip Technology," *Physical Electronics Laboratory*, pp. 603-608, © 1998.

(Continued)

*Primary Examiner* — Evan Pert
(74) *Attorney, Agent, or Firm* — Patterson Thuente Christensen Pedersen, P.A.

(57) ABSTRACT

Embodiments relate to IC current sensors fabricated using thin-wafer manufacturing technologies. Such technologies can include processing in which dicing before grinding (DBG) is utilized, which can improve reliability and minimize stress effects. While embodiments utilize face-up mounting, face-down mounting is made possible in other embodiments by via through -contacts. IC current sensor embodiments can present many advantages while minimizing drawbacks often associated with conventional IC current sensors.

18 Claims, 7 Drawing Sheets

U.S. PATENT DOCUMENTS

| | | | |
|---|---|---|---|
| 2012/0049884 A1* | 3/2012 | Kaltalioglu | 324/762.03 |
| 2012/0112365 A1* | 5/2012 | Ausserlechner et al. | 257/777 |

FOREIGN PATENT DOCUMENTS

| | | |
|---|---|---|
| DE | 10233129 A1 | 2/2003 |
| DE | 10231194 | 2/2004 |
| DE | 19946935 | 2/2004 |
| WO | WO 01/23899 A1 | 4/2001 |
| WO | WO 2005/033718 A1 | 4/2005 |
| WO | WO 2008/008140 | 1/2008 |
| WO | WO 2009/088767 | 9/2009 |

OTHER PUBLICATIONS

Application and File History of U.S. Appl. No. 12/630,596, filed Dec. 3, 2009, Inventor: Ausslechner.

Allego, *Allego Hall Effect-Based Current Sensor ICs: Revolutionary, high accuracy, high bandwidth current sensing!*, www.allegomicro. com/en/Products/Design/curren_sensors/index.asp, 5 pages, © 2010.

Allego, *Hall-Effect Sensor IC's: Current Sensor ICs*, 1 page, © 2010.

Allego, *High Bandwidth, Fast Fault Response Current Sensor IC in Thermally Enhanced Package*, ACS709-DS, www.microallegro. com, 16 pages, © 2008-2009.

Allegro, *Fully Integrated, Hall Effect-Based Linear Current Sensor IC with 2.1 kVRMS Isolation and a Low-Resistance Current Conductor*, ACS712-DS, Rev. 13, 14 pages, © 2006-2010.

Sandireddy, Sandhya, *IEEE Xplore*, © 2005, *Advanced Wafer Thinning Technologies to Enable Multichip Packages*, pp. 24-27.

Lutz et al., "Double-Sided Low-Temperature Joining Technique for Power Cycling Capability at High Temperature," *EPE 2005-Dresden*, ISBN: 90-75815-08-5.

Schwarzbauer et al., "Novel Large Area Joining Technique for Improved Power Device Performance," *IEEE Transactions on Industry Applications*, vol. 27, No. 1, pp. 93-95, 1991.

* cited by examiner

THIN-WAFER CURRENT SENSORS

TECHNICAL FIELD

The invention relates generally to integrated circuit (IC) current sensors and more particularly to IC current sensors fabricated according to a thin-wafer manufacturing process.

BACKGROUND

Desired properties of galvanically isolated integrated circuit (IC) current sensors include high magnetic sensitivity; high mechanical stability and reliability; low stress influence to Hall sensor elements near chip borders; high thermal uniformity and low thermal gradients; high isolation voltage; and low manufacturing costs. Conventional current sensors can include one or more features or be manufactured in ways that aim to address these desired properties.

For example, some current sensors use the leadframe as a current lead. Others also include a magnetic core. Such sensors, however, can be expensive to manufacture.

Other current sensors include additional layers, such as special magnetic layers on top of the silicon die or a thick metal layer formed on the isolation layer. These sensors are also expensive, and the former can be sensitive to disturbance fields and can suffer from drawbacks related to the positioning of the current leading wire outside of the IC.

Therefore, there is a need for a galvanically isolated IC current sensor having desired properties while minimizing drawbacks.

SUMMARY

In an embodiment, a thin-wafer integrated circuit current sensor comprises a current conductor; a thin-wafer semiconductor chip substantially free of dicing defects more than about 10 micrometers ($\mu$m) inward from chip edges; at least one magnetic field sensing element arranged on a surface of the thin-wafer semiconductor chip; and an isolation layer between the current conductor and the thin-wafer semiconductor chip.

In an embodiment, a method comprises dicing less than a full thickness of a silicon wafer from a first side; applying a laminating tape to the first side of the silicon wafer; back-grinding a second side of the silicon wafer; applying a dicing tape to the second side of the silicon wafer; removing the laminating tape; overetching the silicon wafer; singulating semiconductor chips of the semiconductor wafer; and forming a magnetic field current sensor with at least one of the singulated semiconductor chips.

In an embodiment, a thin-wafer integrated circuit current sensor comprises a current conductor; a thin-wafer semiconductor chip having at least one over-etched dicing-before-grinding (DBG) edge, the at least one edge comprising a defect region extending inward about 10 micrometers ($\mu$m) from the at least one edge; at least one magnetic field sensing element arranged on the thin-wafer semiconductor chip; and an isolation layer between the current conductor and the thin-wafer semiconductor chip.

BRIEF DESCRIPTION OF THE DRAWINGS

The invention may be more completely understood in consideration of the following detailed description of various embodiments of the invention in connection with the accompanying drawings, in which.

Figure 1:
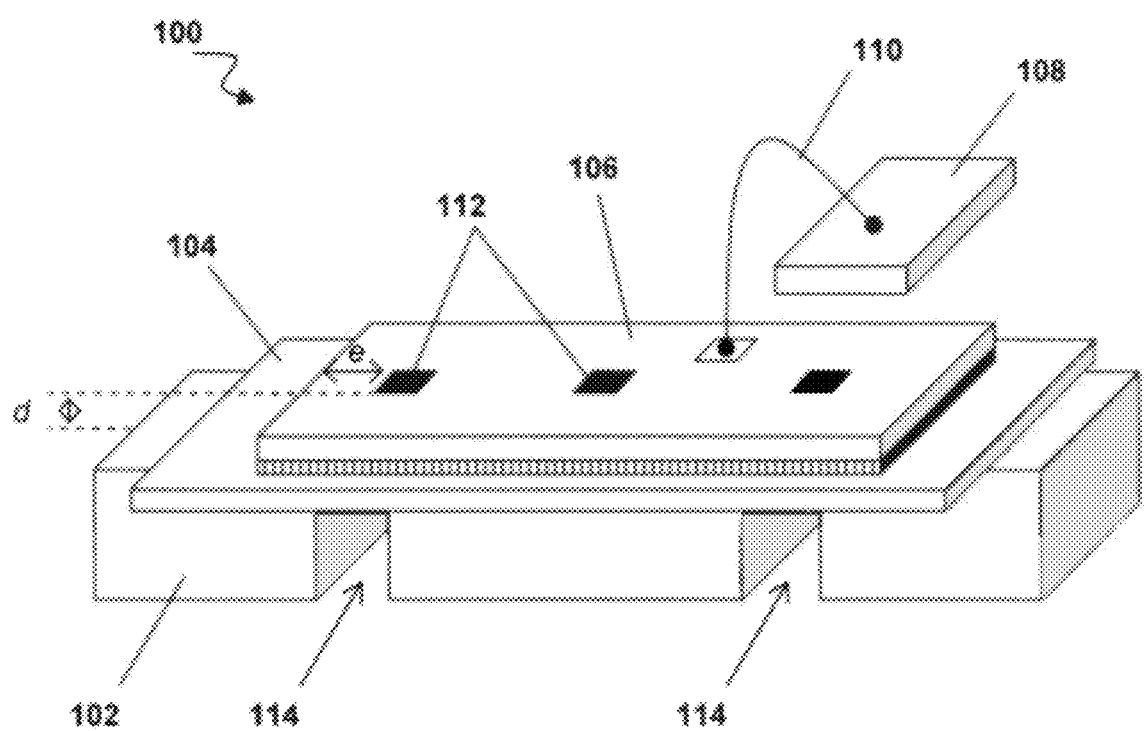
FIG. 1 depicts a block diagram of a sensor according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to IC current sensors fabricated using thin-wafer manufacturing technologies. Such technologies can include processing in which dicing before grinding (DBG) is utilized, which can improve reliability and minimize stress effects. While embodiments utilize face-up mounting, face-down mounting is made possible in other embodiments by via through-contacts or other contacts to the surface of the chip coupled to an isolation layer. IC current sensor embodiments can present many advantages while minimizing drawbacks often associated with conventional IC current sensors.

Referring to FIG. 1, an embodiment of an IC current sensor 100 comprises a current conductor 102, an isolation layer 104 formed thereupon, and a thin-wafer chip 106 coupled to a signal pin 108 by a bond wire 110. In an embodiment, thin-wafer chip 106 is manufactured according to a thin-wafer manufacturing process, which can include wafer dicing before grinding and optional backside etching and will be discussed in more detail below.

Magnetic sensor elements 112, such as Hall effect elements in an embodiment, are arranged on a surface of thin-wafer chip 106. In an embodiment, current conductor 102 includes one or more slots 114 which can help to define a current flow path through current conductor 102. When sensor elements 102 are positioned relative to slots 114, each slot 114 can strategically concentrate current flow lines to maximize a magnetic field in the vicinity of each sensor element 112. Applicants also refer to co-owned U.S. patent application Ser. Nos. 12/630,596, 12/711,471 and 12/756,652, which are incorporated herein by reference in their entireties.

Utilizing a thin-wafer process, thin-wafer chip 106 can have a thickness much less than 200 $\mu$m, such as about 50 $\mu$m or less or even about 20 $\mu$m or less in embodiments. Such thicknesses are much smaller than those of conventional thick wafers, reducing the vertical (with respect to the orientation of FIG. 1 on the page) distance d between sensor elements 112 and current conductor 102. This can improve the accuracy of sensor 100 by avoiding stress effects due to the smaller ratio of chip thickness d to edge distance e. For example, e can be about 75 $\mu$m and d in a range of about 25 $\mu$m to about 65 $\mu$m in thin wafer fabrication embodiments. While all chips experience some degree of stress, homogenous stress across the chip is better than having areas of inhomogeneous stress. In embodiments, inhomogeneous areas occur near the edge of chip 100. Thus, edge distance e is a critical stress distance, particularly if e is less than d. With sensor elements 112 positioned closer to the edge because of the thinner wafer, more area of chip 106 is homogenous rather than inhomogeneous because distance e is not smaller or comparable to chip thickness d. Further, it is desired to position sensor elements 112 near slots 114 but also to have slots 114 spaced farther apart from one other without increasing the chip size. Thus, sensor 100 enables a more efficient use of chip space because of the more homogenous stress and the related positioning advantages the more homogenous stress presents. A significant advantage of smaller distance d is also an increased sensitivity of sensor 100 given the smaller distance between sensor elements 112 and current that flows through current conductor 102. Further, the smaller thickness of chip 106 compared to the thickness of current conductor 102 can provide more uniform and/or smaller temperature gradients and better compensation of circuits on chip, along with higher accuracy. Thin-wafer manufacturing also provides cleaner, smoother edges of chip 106, with fewer chips and other defects, and later-developing cracks, that can affect reliability, increase stress and otherwise reduce the lifetime performance of sensor 100.

Figure 2A:
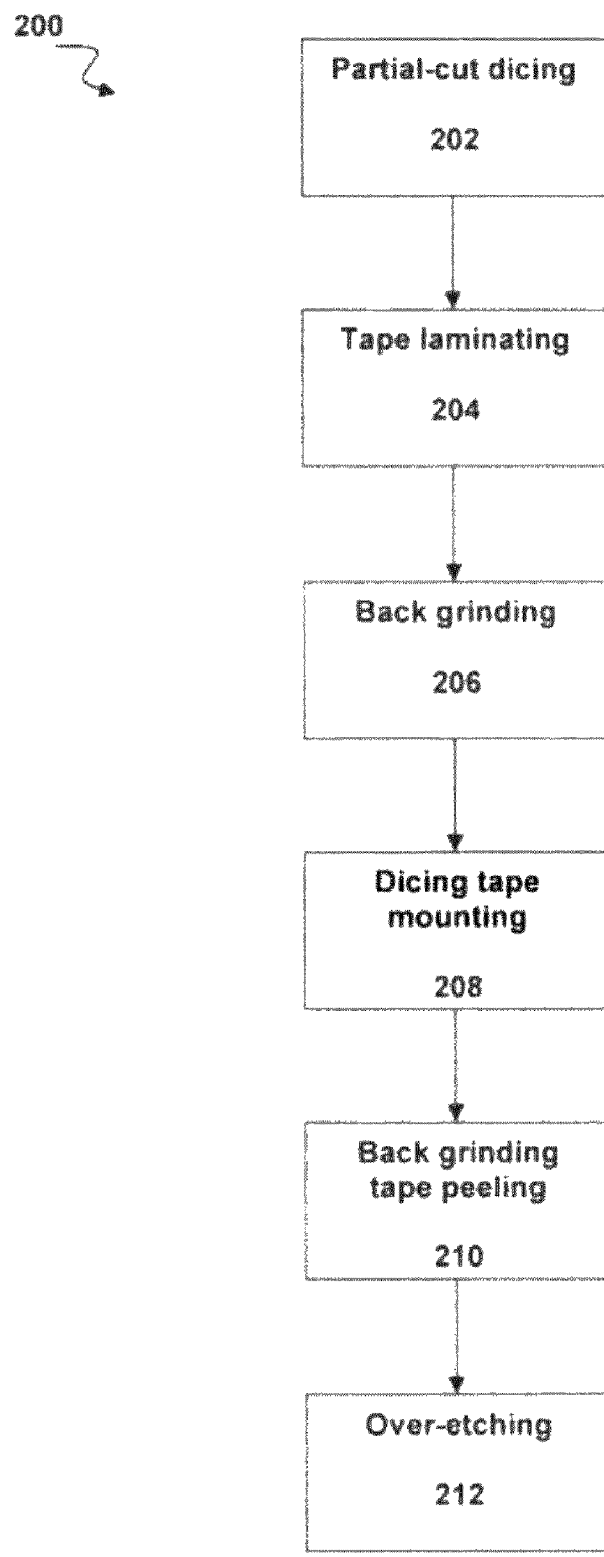
FIG. 2A depicts a flow chart of a dicing before grinding process according to an embodiment.

Referring to FIG. 2A, an embodiment of a thin-wafer manufacturing process 200 is illustrated. At 202, a silicon wafer is partially, such as half-cut in an embodiment, diced. At 204, laminating tape is applied to one side of the silicon wafer before back grinding to thin the wafer at 206. At 208, dicing tape is applied to the wafer, on the side without the laminating tape, which is then removed from the wafer at 210. An over-etching process is then carried out at 212.

Figure 2B:
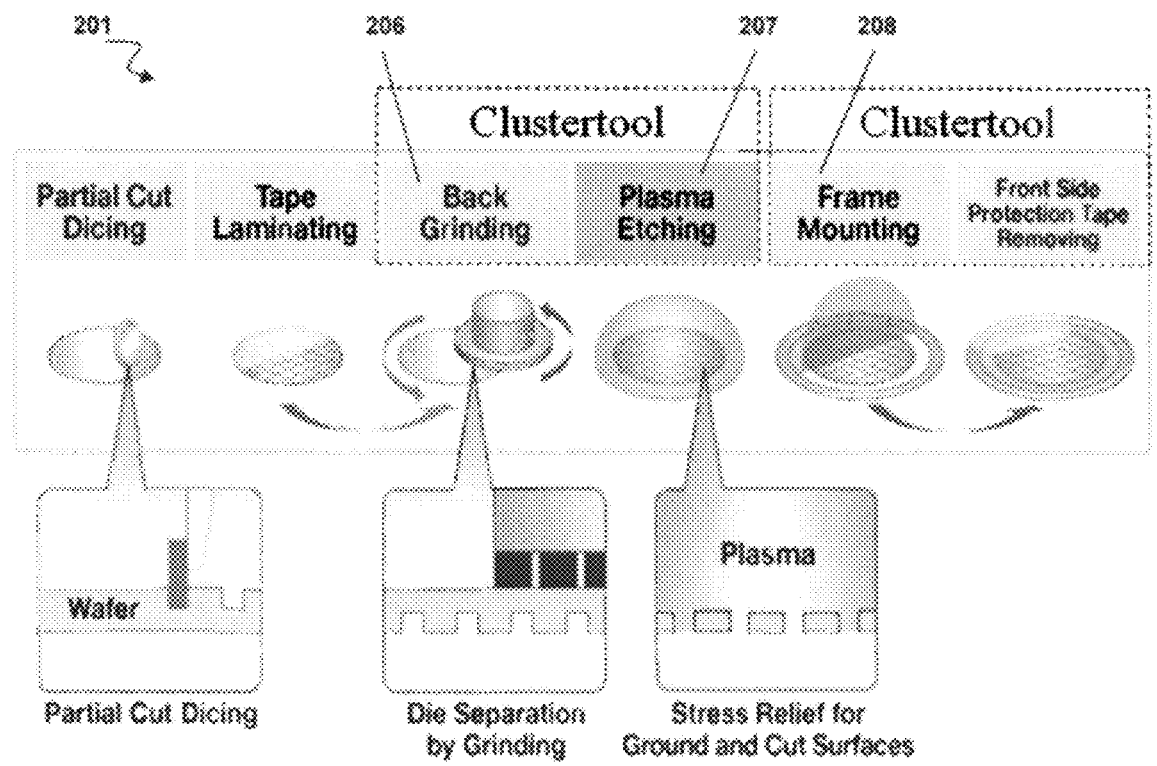
FIG. 2B depicts a flow diagram of a dicing before grinding process according to an embodiment.

Another embodiment is depicted in FIG. 2B. Process 201 illustrates an additional plasma etch 207 between back grinding at 206 and frame or tap mounting at 208.

Figure 3:
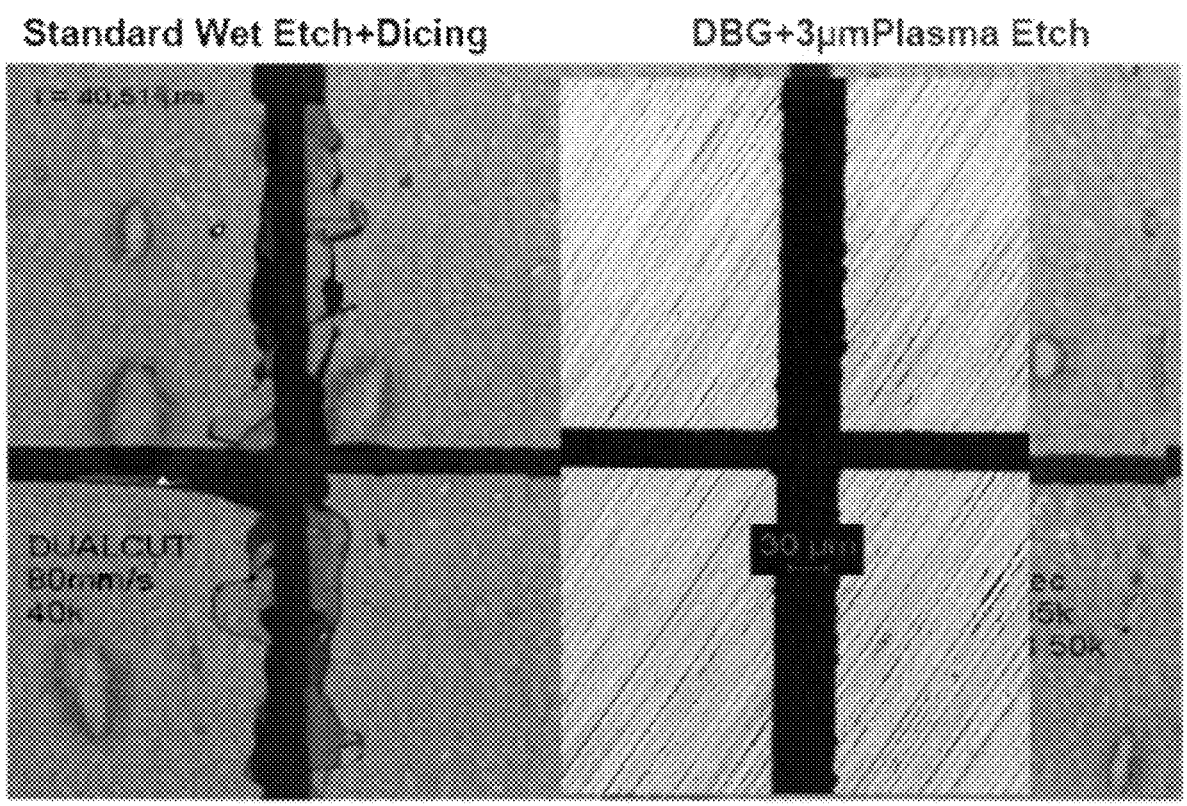
FIG. 3 depicts wafer images according to embodiments.

Compared with other manufacturing processes, thin-wafer process 200 includes dicing before grinding, i.e., 202 before 206. Further, the dicing at 202 is partial-cut dicing, compared with conventional processes which saw through the entire thickness of the wafer. Dicing before grinding, as in process, 200 results in a thin-wafer that has smoother edges, free of the chipping, cracking and other defects associated with other methods. This can be seen in FIG. 3, which depicts images of a standard process (on the left) and a thin-wafer process using dicing before grinding and a plasma etch (on the right). In the standard process wafer image, chips and cracking caused by the saw blade as it cuts through the silicon wafer extend about 40 μm into the wafer from the sawing gap.

In contrast, the dicing before grinding wafer image shows chips extending only about 10 μm or less into the edge of the wafer from the sawing gap. In general, current sensors are very sensitive to stress caused by piezo-effects that change the alter the sensitivity of the sensing elements, more so than other sensors. While a thin die is desired, thin dies have stress challenges. Using over-etching as part of the dicing before grinding thin wafer process further refines and improves the chip edges such that a thin-wafer is suitable for use in a current sensor.

Figure 4:
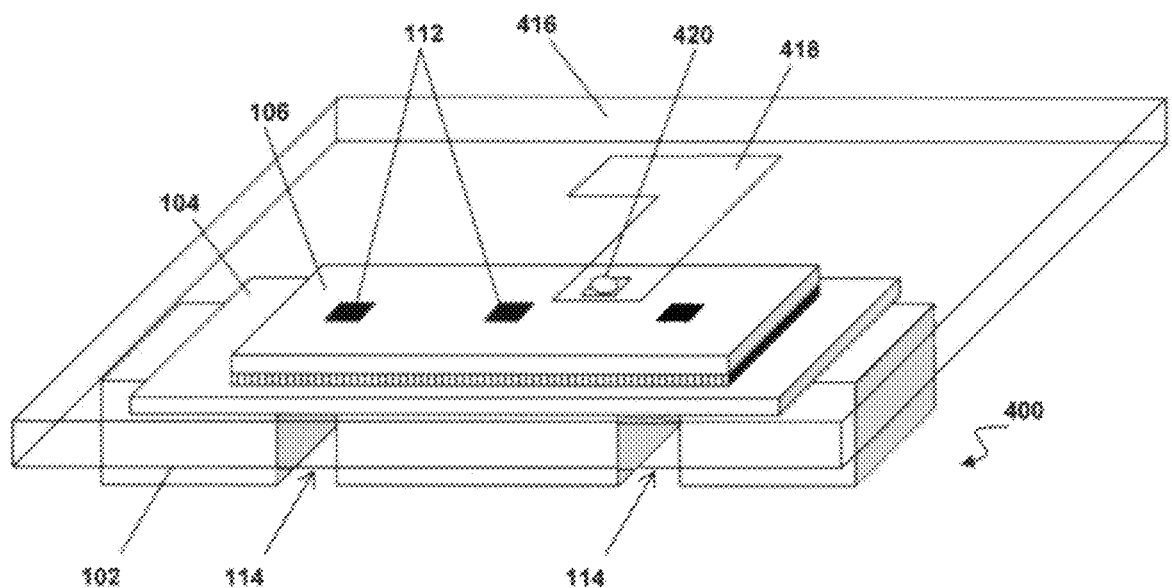
FIG. 4 depicts a block diagram of a sensor according to an embodiment.

Another embodiment of a thin-wafer current sensor 400 is depicted in FIG. 4. Sensor 400 is similar to sensor 100 but is mounted to a printed circuit board (PCB) 416 on top of thin-wafer chip surface 106. PCB 416 includes a copper trace 418 on the bottom side of PCB 416, and solder bumps 420 couple thin-wafer chip surface 106 to trace 418 of PCB 416.

Figure 5:
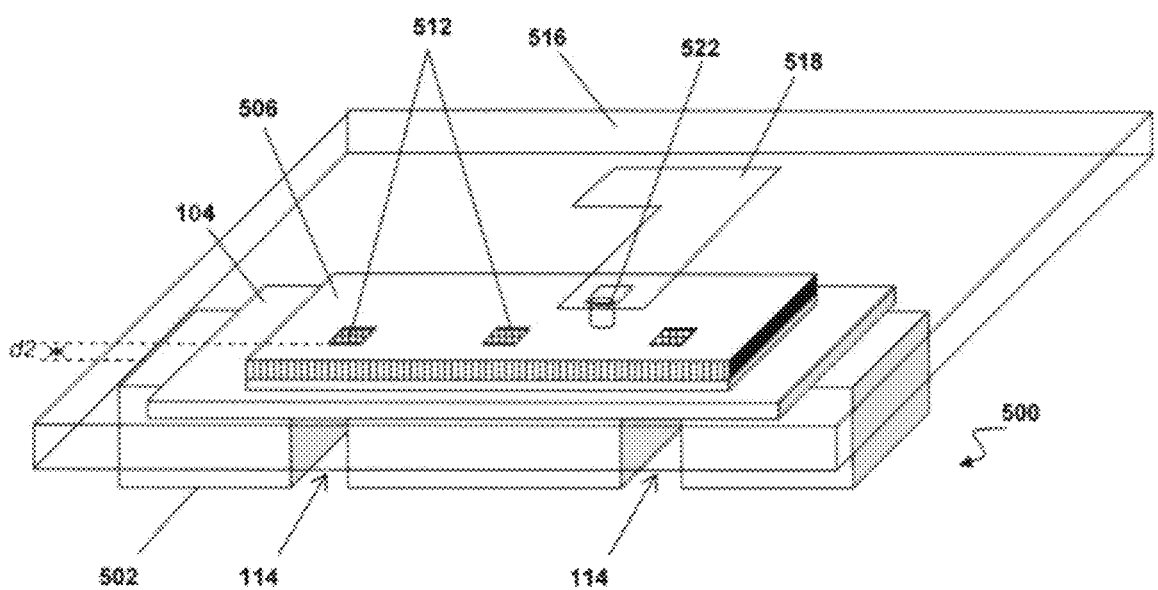
FIG. 5 depicts a block diagram of a sensor according to an embodiment.

In FIG. 5, a thin-wafer current sensor 500 is mounted face-down to a copper trace 518 of a PCB 516 by a via through-hole 522. Through-hole 522 can be easily accommodated by embodiments of a thin-wafer manufacturing process as discussed herein and do not require the conductor to be smaller than the die as in conventional face-down mounting because embodiments permit formation of contacts from the rear side of the die. Sensor 500 can therefore have an increased magnetic field signal because of the smaller distance d2 between sensor elements 512 and current conductor 502 due to the face-down mounting of chip 506. Sensor elements 512 are depicted here arranged on a bottom surface of thin-wafer chip 506

Figure 6:
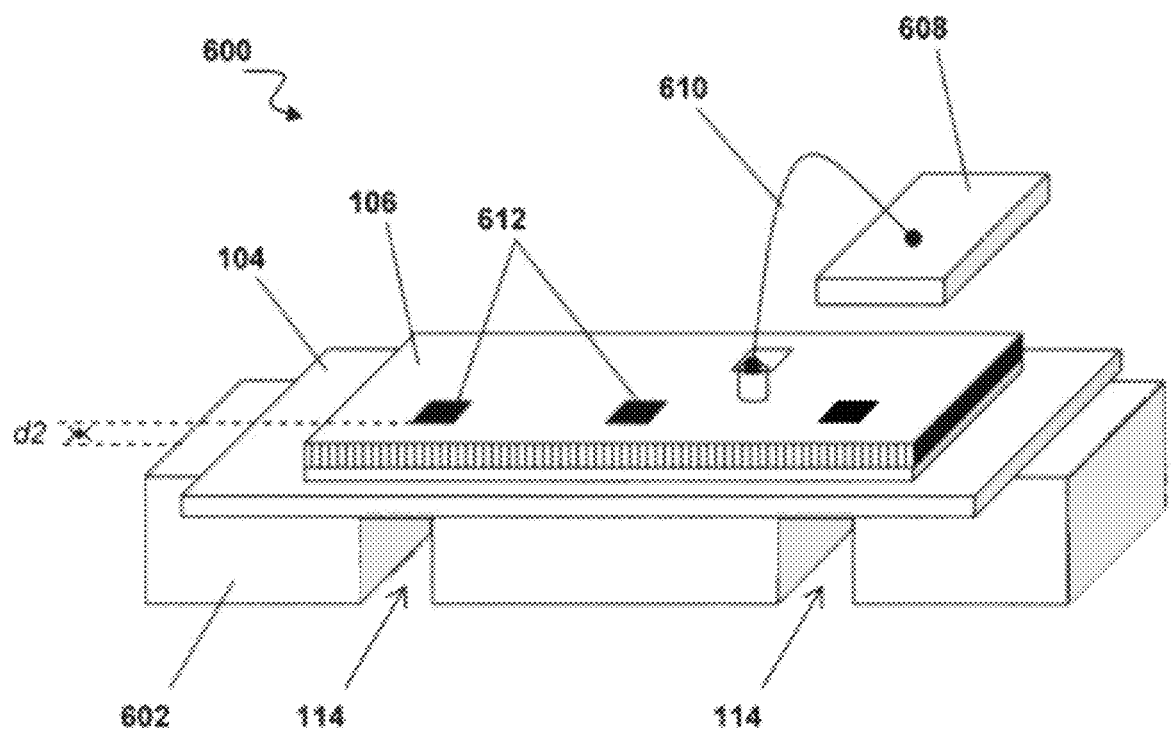
FIG. 6 depicts a block diagram of a sensor according to an embodiment.

In another face-down mounting embodiment depicted in FIG. 6, a thin-wafer current sensor 600 comprises a via through-hole 622 coupled to a signal pin 608 by a bond wire 610. Similar to sensor 500 of FIG. 5, sensor 600 can provide an increased magnetic field signal because of the smaller distance d2 between sensor elements 612 and current conductor 602.

In another embodiment, a thin-wafer semiconductor chip is coupled to a carrier or signal-conducting layer comprising, for example, glass or ceramic. This carrier layer is substantially thicker, such as at least twice as thick, than the thin-wafer semiconductor chip.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, implantation locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention may comprise a combination of different individual features selected from different individual embodiments, as understood by persons of ordinary skill in the art.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A thin-wafer integrated circuit current sensor comprising:
   a current conductor;
   a thin-wafer semiconductor chip substantially free of dicing defects more than about 10 micrometers (μm) inward from chip edges;
   at least one magnetic field sensing element arranged on a surface of the thin-wafer semiconductor chip; and an isolation layer between the current conductor and the thin-wafer semiconductor chip.

2. The sensor of claim 1, wherein the at least one magnetic field sensing element comprises a Hall effect element.

3. The sensor of claim 1, wherein the current conductor comprises at least one slot.

4. The sensor of claim 3, wherein the at least one magnetic field sensing element is arranged relative to an end of the at least one slot.

5. The sensor of claim 1, wherein the at least one magnetic field sensing element is arranged on a first surface of the thin-wafer semiconductor chip and the isolation layer is adjacent a second surface of the thin-wafer semiconductor chip, the first and second surfaces of the thin-wafer semiconductor chip being parallel to one another.

6. The sensor of claim 5, wherein an area of the second surface of the thin-wafer semiconductor chip is less than an area of an adjacent surface of the isolation layer.

7. The sensor of claim 1, wherein the thin-wafer semiconductor chip is coupled to a signal pin by a bond wire.

8. The sensor of claim 1, wherein the thin-wafer semiconductor chip is coupled to a printed circuit board (PCB) by a solder bump.

9. The sensor of claim 1, wherein the at least one magnetic field sensing element is arranged on a first surface of the thin-wafer semiconductor chip opposite the isolation layer.

10. The sensor of claim 9, wherein the thin-wafer semiconductor chip comprises a via through-hole.

11. The sensor of claim 10, wherein the thin-wafer semiconductor chip is coupled to a printed circuit board (PCB) by the via through-hole.

12. The sensor of claim 10, wherein the via through-hole of the thin-wafer semiconductor chip is coupled to a signal pin by a bond wire.

13. The sensor of claim 9, wherein an area of the first surface of the thin-wafer semiconductor chip is less than an area of an opposite surface of the isolation layer.

14. The sensor of claim 1, wherein the thin-wafer semiconductor chip is coupled to at least one of a signal-conducting layer or a carrier layer, wherein the at least one signal conducting layer or carrier layer comprises at least one of glass or a ceramic and has a thickness that is at least twice a thickness of the thin-wafer semiconductor chip.

15. The sensor of claim 1, wherein the thin-wafer semiconductor chip is over-etched.

16. The sensor of claim 1, wherein the thin-wafer semiconductor chip has a thickness of less than about 100 micrometers ($\mu$m).

17. The sensor of claim 1, wherein a distance between the at least one magnetic field sensing element and the current conductor is less than about 100 micrometers ($\mu$m).

18. A thin-wafer integrated circuit current sensor comprising:
a current conductor;
a thin-wafer semiconductor chip having at least one over-etched dicing-before-grinding (DBG) edge, the at least one edge comprising a defect region extending inward about 10 micrometers ($\mu$m) from the at least one edge;
at least one magnetic field sensing element arranged on the thin-wafer semiconductor chip; and
an isolation layer between the current conductor and the thin-wafer semiconductor chip.

* * * * *